United States Patent [19]

Katakura

[11] Patent Number: 5,430,336
[45] Date of Patent: Jul. 4, 1995

[54] EMITTER COUPLED LOGIC CIRCUIT

[75] Inventor: Masayuki Katakura, Kanagawa, Japan

[73] Assignee: Sony Corporation, Japan

[21] Appl. No.: 132,970

[22] Filed: Oct. 7, 1993

[30] Foreign Application Priority Data

Oct. 23, 1992 [JP] Japan .................. 4-309559
Oct. 28, 1992 [JP] Japan .................. 4-313993

[51] Int. Cl.$^6$ .......................................... H03K 19/20
[52] U.S. Cl. ....................... 326/126; 377/70; 377/73
[58] Field of Search ................ 307/455; 377/70, 73

[56] References Cited

U.S. PATENT DOCUMENTS

| | | | |
|---|---|---|---|
| 4,692,641 | 9/1987 | Highton | 377/73 |
| 4,733,218 | 3/1988 | Traa | 377/70 |
| 5,103,117 | 8/1992 | Voorman | 307/455 |
| 5,134,312 | 7/1992 | Jones | 307/455 |

Primary Examiner—Edward P. Westin
Assistant Examiner—Andrew Sanders
Attorney, Agent, or Firm—Ronald P. Kananen

[57] ABSTRACT

A emitter coupled logic circuit is reduced in circuit scale, while maintaining the speed of shift registers and compatibility with analog circuits. When data held in the first self-holding circuit section 41 or the second self-holding section 42 is deleted, the threshold voltage VTH applied to the base electrodes of the first and third transistors Q41 and Q43 is set outside the logical amplitude. When data is transferred, also, the threshold voltage VTH is set at a value intermediate to the logical amplitude. Because of this the data held in the first and second self-holding circuit sections can be reliably deleted without an increase in the number of elements. Further, it enables a shift register to be composed of at least 50% fewer elements than before, and can bring about a marked improvement in integration and a marked reduction in power consumption, by arranging a first self-holding circuit section consisting of first and second transistors, a second self-holding circuit section consisting of third and fourth transistors, and a switching circuit alternately switching the operational states of the first and second self-holding circuit sections, and transferring data retained in the first self-holding circuit section to the second self-holding circuit section on a collector current led from the collector electrode of the third transistor to the collector electrode of the second transistor.

6 Claims, 6 Drawing Sheets

EMITTER COUPLED LOGIC CIRCUIT

BACKGROUND OF THE INVENTION

1. Field of the Invention

This invention relates to an emitter coupled logic circuit, and is applicable to shift registers and frequency dividers, for example.

2. Description of the Related Art

Nowadays, it is becoming more common to set a signal processing mode based on various control data output as serial data from a microprocessor in signal processing integrated circuits (hereinafter referred to as signal processing IC) for processing analog signals as well.

In the case of a car-mounted stereo system, for example, sound is usually reproduced under control with touch-pad input keys and according to setup information selected by a user through the user's setting of a sound volume, balance in the sound volume between the right-hand and left-hand speakers, and various functions, such as a tone control and a fader, by using serial data.

On this occasion, shift registers for receiving serial data, latch aided serial-to-parallel conversion, data retention, etc. are indispensable for performing these functions, and their logic circuits are normally composed of emitter coupled logic circuits (hereinafter called ECL circuits), integrated injection logic (IIL) circuits, and so forth.

Figure 1:
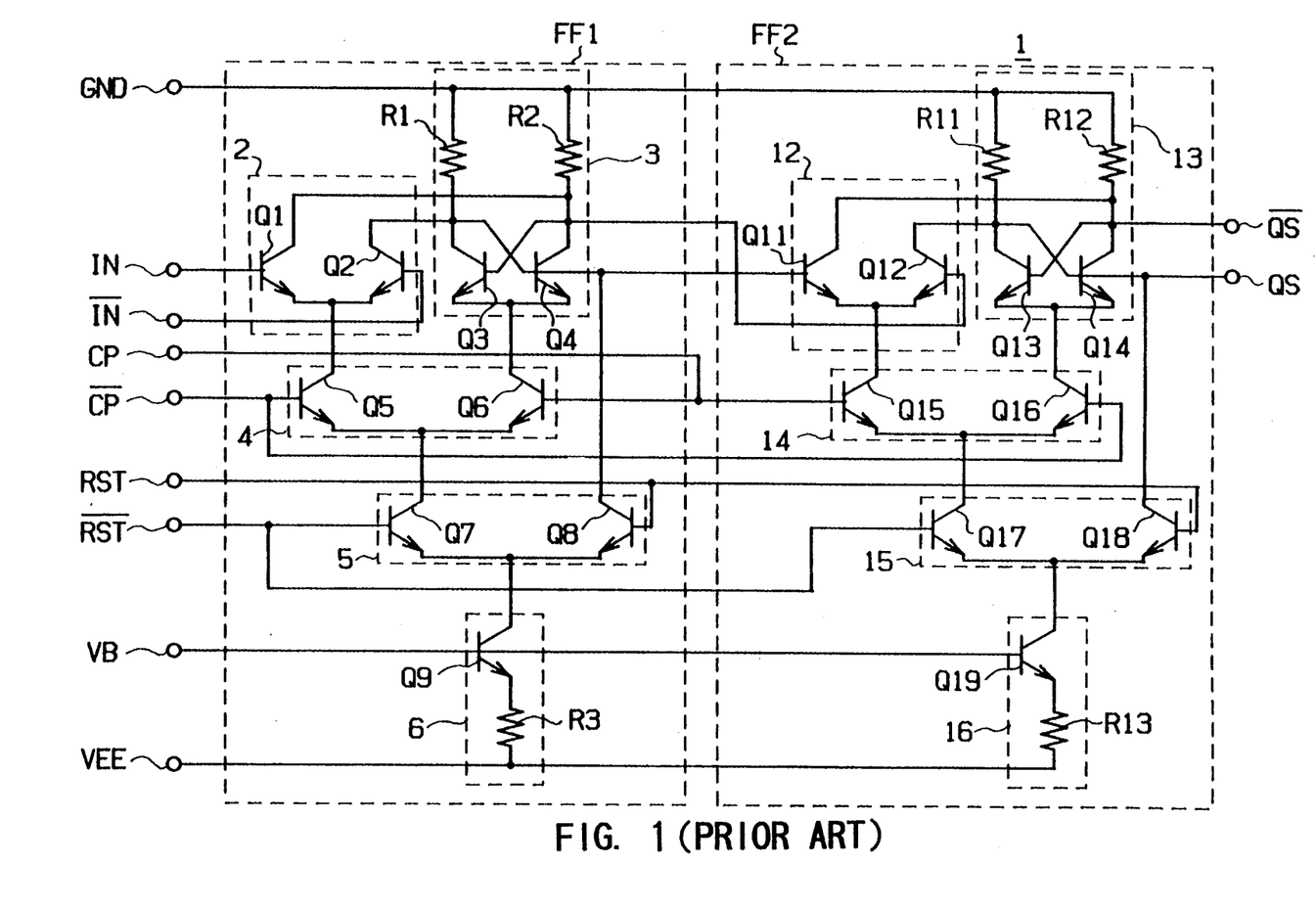
FIG. 1 is a connection diagram showing a configuration of a conventional shift register.

For example, a conventional shift register can be composed of a cascade connection of two flip-flops, FF1 and FF2, as shown in FIG. 1, such a shift register is disadvantageous in that many elements constitute a stage, and that the circuit scale is rather large when connecting a shift register of two or more stages.

As this reason, the flip-flops FF1 and FF2 are basically composed of transfer gates 2 and 12 consisting of two differential pairs of transistors Q1, Q2 and Q11, Q12, and latch gates 3 and 13 consisting of load resistors R1, R2 and R11, R12, and transistors Q3, Q4 and Q13, Q14.

The operational states of the transfer gates 2 and 12 and the latch gates 3 and 13 are switched by switching gates 4 and 14 consisting, respectively, of one differential pair of transistors Q5 and Q6, and the other differential pair of transistors Q15 and Q16.

Also, the switching gate 4 and 14 are connected to reset gates 5 and 15 and current sources 6 and 16.

If the reset signal RST is a logic level "L", since a transistor Q7 becomes "ON", the reset gate 5 controls the switching circuit 4 to remain "ON" by leading current from the common emitters of the transistors Q5 and Q6, via the transistor Q7.

If the reset signal RST is a logic level "H", since a transistor Q8 becomes "ON", the reset gate 5 forcibly turns the potential of the connection midpoint QM to logic level "L" by leading current from the connection midpoint QM of the load resistor R1 and the transistor Q3 via the transistor Q8 of the reset gate 5.

However, if a shift register is composed of cascade connection such flip-flops FF1 and FF2, it is necessary to arrange about 24 elements a stage, as shown in FIG. 1. Thus, to constitute a shift register of 50 stages, no fewer than 1200 elements are required, resulting in a very large circuit scale, as evident from FIG. 1.

Figure 2:
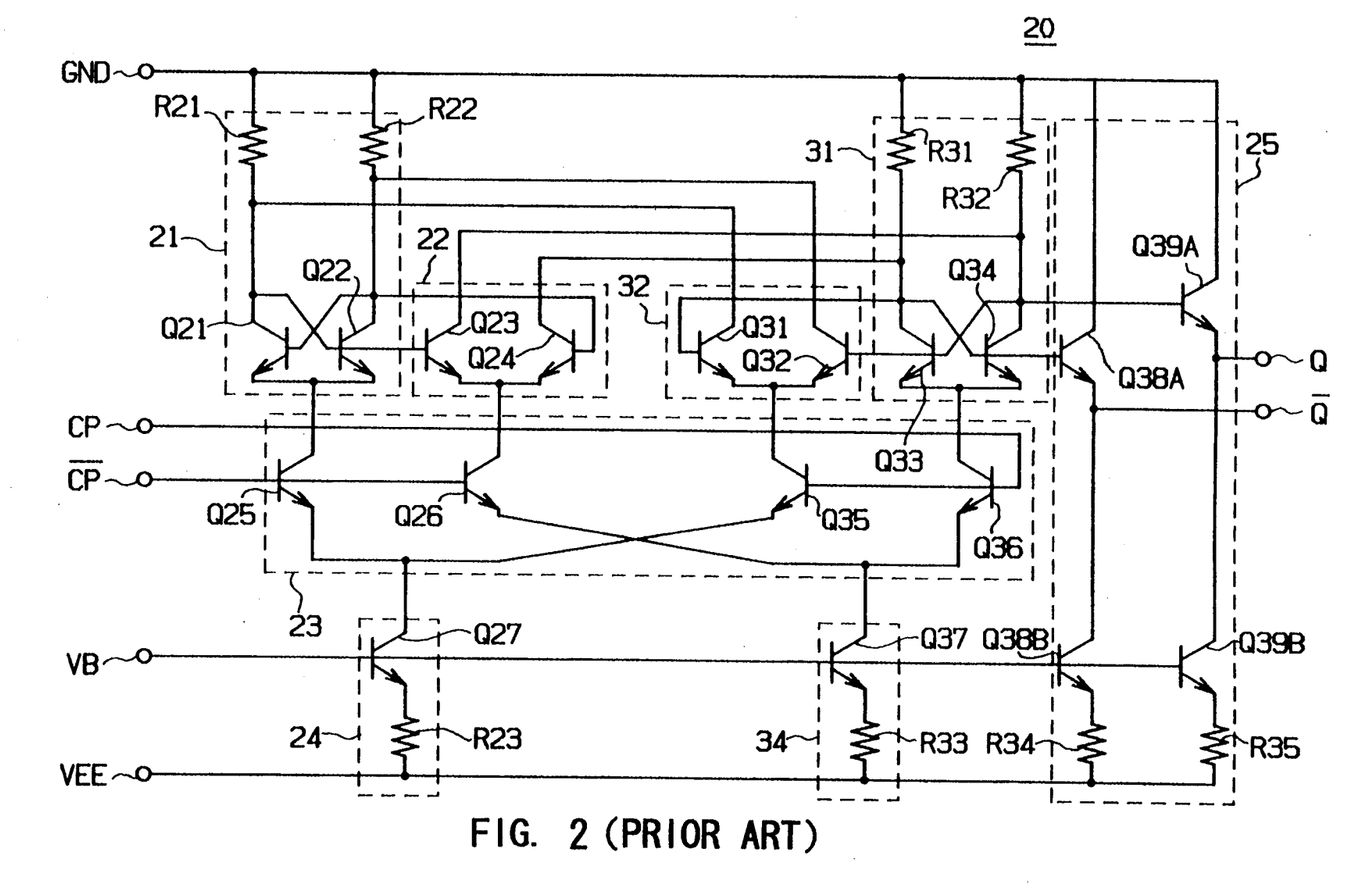
FIG. 2 is a connection diagram showing the configuration of the conventional frequency divider.

Similarly, among ECL circuits of this related art equipped with transfer gates and latch gates, the one shown in FIG. 2 is widely known. And in this case the need to arrange a large number of elements per a stage also causes a disadvantage in that a very large circuit scale is required for constituting a multistage frequency divider.

That is, in the case of the frequency divider 20, changing operational states is effected by alternately switching through switching gate 23 the currents to be led from the latch gate 21 and transfer gate 22, latch gate 31 and transfer gate 32 into the current sources 24 and 34 respectively.

The frequency-divided output of the clock pulse signal CP, from output terminals Q and $\overline{Q}$ of the output stage 25 undergoes polarity inversion in transferring the state of one gate to another or retransferring the state of one gate to another.

However, in a case constituting a frequency divider like this, about 26 elements are required in a stage as evident from FIG. 2, and still more elements are required to constituting a multistage frequency divider. As a result a problem arises in that circuit scale becomes very large.

SUMMARY OF THE INVENTION

In view of the foregoing, the first object of this invention is to provide emitter coupled logic circuits to reduce the circuit scale of emitter coupled logic circuits while maintaining the speed of shift registers and compatibility with analog circuits.

The second object of this invention is to provide emitter coupled logic circuits in which, when data held in first and second self-holding sections are deleted, the threshold voltage VTH applied to the base electrodes of the first and third transistors are set outside the logical amplitude, and when data is transferred, the threshold voltage VTH is set at a value intermediate to the logical amplitude. Because of this the data held in the first and second self-holding circuit sections can be reliably deleted without an increase in the number of elements.

The third object of this invention is to provide emitter coupled logic circuits in which, a first and second self-holding circuit and a switching circuit alternately switching the operational states of the first and second self-holding circuits are arranged, and data retained in the first self-holding circuit section is transferred to the second self-holding circuit section based on a collector current led from the second self-holding circuit, so that the number of shift registers can be less than one half of conventional circuit and it can bring about a marked improvement in integration and a marked reduction in power consumption.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

(1) First Embodiment

The first embodiment of this invention will be described with reference to FIGS. 3, 4, and 5.

Figure 3:
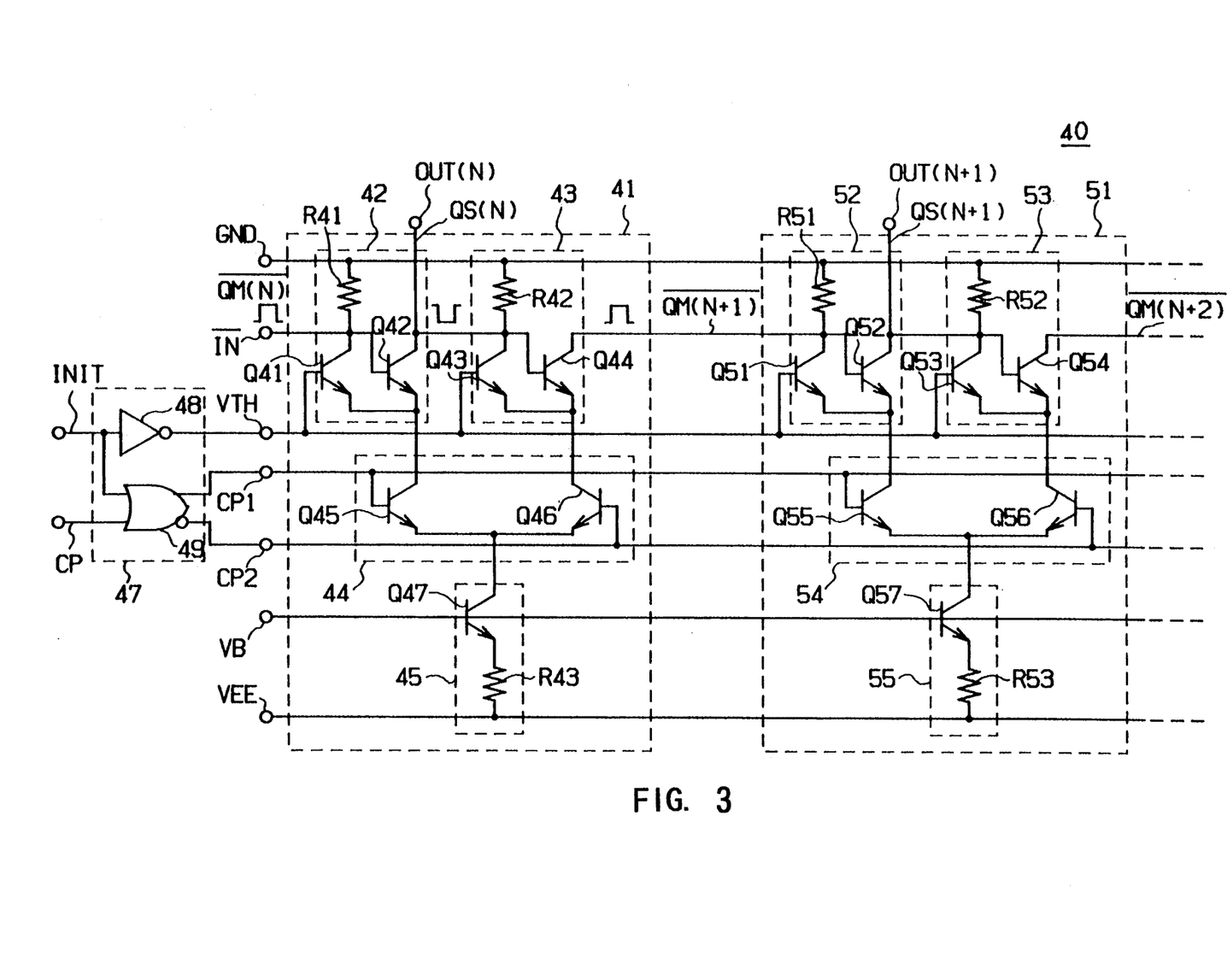
FIG. 3 is a connection diagram showing a shift register using the first embodiment of an emitter coupled logic circuit of this invention.

FIG. 3 generally shows an ECL-type shift register 40, consisting of two shift register stages 41 and 51 cascade connected, each consisting of ten elements. In the ECL circuit, it will be described for example, the higher electric potential as grand level, and the lower electric potential as VEE, that is, negative power source.

Here, the first shift register stage 41 is similar in composition to the second shift register stage 51 of the shift register 40.

That is, the shift register stages 41 and 51 consist of two latch gates 42 and 43, 52 and 53, switching gates 44 and 54, and constant-current sources 45 and 55, respectively.

The following describes the shift register stage 41. The latch gates 42 and 43 are composed respectively, of NPN-type bipolar transistors Q41 and Q42, Q43 and Q44, the emitters of which are respectively connected in common.

Here, of these pairs of transistors, the bases of the latter common-collector transistors Q42 and Q44 are connected to the collectors of the former common-base transistors Q41 and Q43, and the resistors R41 and R42 developing logic amplitudes are connected between the corresponding nodes and the ground potential (GND).

Figure 4:
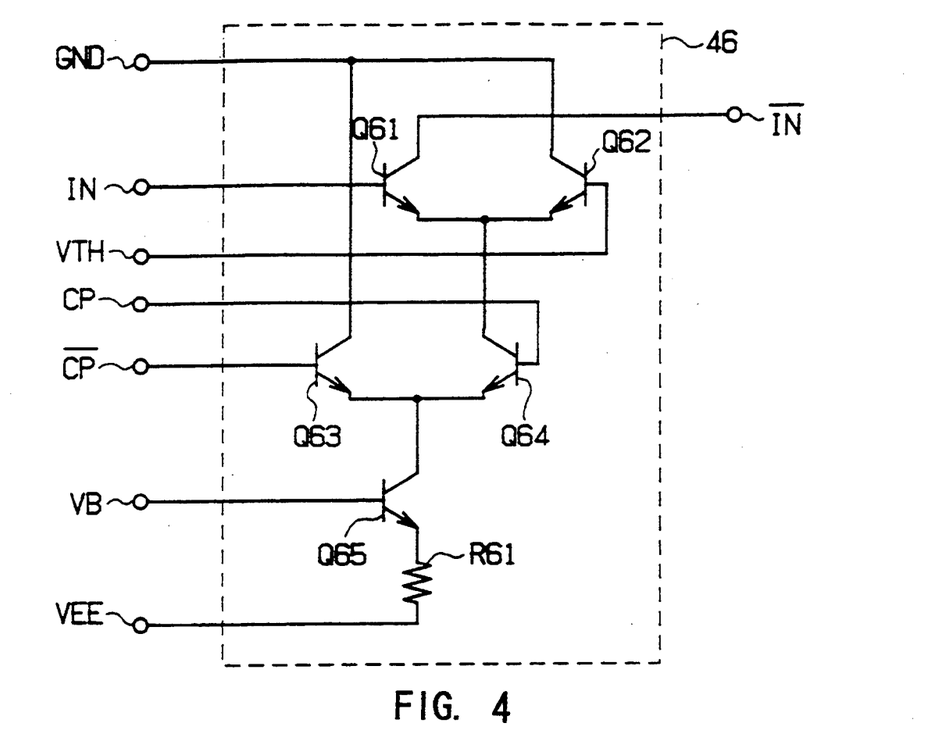
FIG. 4 is a connection diagram explaining the input stage of the shift register shown in FIG. 3.

The latch gates 42 and 43 receive the logic outputs $\overline{IN}$ and QS(N) of a gate drive circuit 46 shown in FIG. 4 and the latch gate 42 respectively, to switch "ON" either the transistors Q41 and Q42 or the transistors Q43 and Q44 according to the comparison result with the threshold voltage VTH input to the bases of the transistors Q41 and Q43.

The switching gate 44 is composed of a differential pair of transistors Q45 and Q46. When a clock pulse input terminal CP1 is the logic level "H", the latch gate 42 is turned "ON". On the contrary, when a clock pulse input terminal CP2 is the logic level "H", the latch gate 43 is turned "ON", thus changing the operational state.

If the potential of the clock pulse input terminal CP1 is the logic level "H", the switching gate 44 directs the logic value of the logic output $\overline{QM(N)}$ of the inverse input signal $\overline{IN}$ to be retained, and selects whether or not to lead in a collector current through the resistor R42 of the latter latch gate 43 in an inactive state, and thus makes the logic output QS(N) of the logical value contrary to the logic output $\overline{QM(N)}$ develop across the resistor R42.

On the other hand, if the potential of the clock pulse input terminal CP2 is the logic level "L", the switching gate 44 directs the latter latch gate 43 to retain the logic value of the logic output QS(N) at the resistor R42, and selects whether or not to lead in a collector current through the resistor R51 of the latch gate 52 of the flip-flop 51 in an inactive state, and thus makes a logic output $\overline{QM(N+1)}$ with a logical value contrary to the logic output QS(N) to be developed across the resistor R51.

The logic output $\overline{QM(N+1)}$ from the output terminal of the shift register stage 41 then has the same phase as the logic output $\overline{QM(N)}$ inputted to the input terminal, and the shift register stage 41 transfers the logic output applied to the input terminal to the shift register stage based on the clock pulse signal CP.

Therefore, in this embodiment, the first latch gate 42 of the shift register stage 41 has not any function for fetching the inverse input signal $\overline{IN}$ when the clock pulse signal CP is the logic level "H", and hence an inverse signal $\overline{IN}$ as the inversion of the input signal IN is transferred by a gate drive circuit 46 shown in FIG. 4, to the latch gate 42.

Here, the gate drive circuit 46 will be described by using FIG. 4. The gate drive circuit 46 consists of a differential pair of transistors Q61 and Q62 and a switching gate for switching the operational states of the differential pair.

The switching of the switching gate is effected by choosing to lead the collector current of the transistor Q65 as a current source into either the transistor Q63 or the transistor Q64.

Also, the shift register 40 shown in FIG. 3, has been so designed as to initialize the logical values of the logic outputs QS(N) and QS(N+1) from the shift register stages 41 and 51 forcibly to the logic level "L" by a reset circuit 47. In this embodiment, the reset circuit 47 consists of an inverter 48 and an OR circuit 49.

Here, the inverter 48 inverts the reset signal INIT and applies a threshold voltage VTH to the threshold voltage input terminal. The OR circuit 49 applies the logical sum of the reset signal INIT and the clock pulse signal CP to the clock pulse input terminal CP1, and applies its inverse output to the other clock pulse input terminal CP2.

Figure 5:
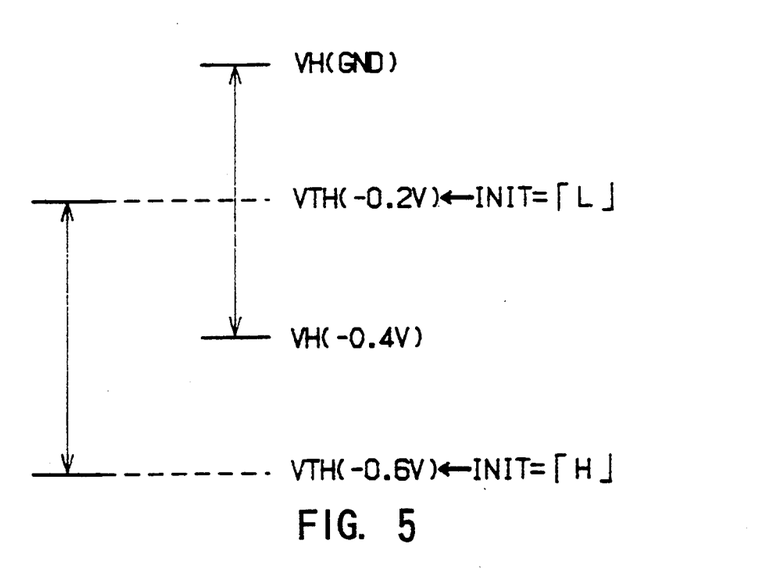
FIG. 5 is a schematic diagram explaining the threshold voltage applied for data transfer and erasion of the shift register shown in FIG. 3.

In the case of this embodiment, as shown in FIG. 5, the reset circuit 47 shown in FIG. 3 sets the threshold voltage VTH at −0.2 [V] when the reset signal INIT is the logic level "L", or when the circuit is in normal operation, but sets the threshold voltage VTH at −0.6 [V] when the reset signal INIT is high, or when the circuit is in reset operation.

As this reason, the value of the threshold voltage VTH valid when the reset signal INIT is the logic level "H" is set at a value low enough in comparison with the voltage value valid when the logical values of the logic outputs QS(N) and QS(N+1) from the shift register stages 41 and 51 is the logic level "L".

Also, the potential of the clock pulse input terminal CP1 given by the logical sum imparted by the OR circuit 49 turns to the logic level "H" when the clock pulse signal CP, or the reset signal INIT, turns to the logic level "H".

Thereupon, the reset circuit 47, when reset, controls the common-collector transistors Q42 and Q52 of the transistors Q41, Q42 and Q51, Q52 which are constituents respectively of the latch gates 42 and 52, to remain "ON", and forcibly turns the logic outputs QS(N) and QS(N+1) to the logic level "L" initialization by leading in the collector current via the load resistors R42 and R52.

The following describes the behavior of the shift register 40 in the above composition in terms of two operations, i.e., the resetting and transferring of latch data.

First, when resetting latch data immediately after turning on the power supply, the shift register 40 turns the reset signal INIT to the logic level "H", sets the threshold voltage VTH at −0.6 [V], and forcibly turns the logical value of the clock pulse input terminal CP1 to the logic level "H".

Of the transistor pair Q45 and Q46 and the transistors Q55 and Q56 which, respectively, constitute the switching gates 44 and 54, the transistors Q45 and Q55 go "ON" to turn the former latch gates 42 and 52 "ON".

Here, the threshold voltage VTH applied to the bases of the transistors Q41 and Q51, respectively, constituting the latch gates 42 and 52 is set at a rather low value, −0.6 [V], and falls outside the logical amplitude, whereupon the transistors Q41 and Q51 go "OFF" and the transistors Q42 and Q52 go "ON" regardless of the values of the logic outputs IQM(N) and IQM(N+1).

Accordingly, the collector current flows from the resistors R42 and R52 of the latch gates 43 and 53 in an inactive state via the transistors Q42 and Q52 into the current sources 45 and 55, whereupon the logic outputs QS(N) and QS(N+1) output from the output terminals forcibly become the logic level "L" for initialization.

Subsequently, data is transferred on the clock pulse signal CP when serial data $\overline{\text{IN}}$ begins to be inputted. The following describes a case where the clock pulse signal CP at the instant is the logic level "L", and the logic output levels QS(N) and QS(N+1) of the first and second shift register stages 41 and 51 are the logic levels "H" and "L", respectively.

In this case, the latter latch gates 43 and 53 behave as latch circuits to hold the logical values of the logic outputs QS(N) and QS(N+1) because the transistors Q46 and Q56 of the switching gates 44 and 54 go "ON".

On the other hand, because the latch gate 52 constituting the former of the second shift register stage 51 is in an inactive state, the logical value of the logic output IQM(N+1) of the latch gate 52 is determined by the collector current led into the transistor Q44.

Here, the logic output QS(N) of the shift register stage 41 is the logic level "H", and hence the logic value "L" as the inversion of the logic output QS(N) is transferred as the logic output IQM(N+1).

When the clock pulse signal CP then turns to the logic value "H", the transistors Q45 and Q55 of the latch gates 44 and 54 go "ON" and the former latch gates 42 and 52 operate as latch circuits, contrary to the above-mentioned case.

Thereupon, the logic outputs QS(N) and QS(N+1) of the shift register stages 41 and 51 are no longer transferred to the latter stage via the transistors Q44 and Q54, whereas the other latch gates 42 and 52 shift to an active state to hold the new state set immediately before.

If, for instance, the logical value of the inverse input signal $\overline{\text{IN}}$ issued immediately before is the logic level "H", then the latch gate 42 holds this logical value and the transistor Q42 goes "ON", therefore, the logic output QS(N) of the shift register 41 is pulled down to the logic level "L".

Again, the latch gate 52 of the next shift register stage 51 holds the logic level "L" of the logic output $\overline{\text{QM}}$(N+1) and the transistor Q51 goes "ON" and outputs the logic level "H" as the logic output QS(N+1) because no collector current flows through the resistor R52.

Thereupon, the logic outputs QS(N) and QS(N+1) of the shift register stages 41 and 51, turn from the logic level "H" and the logic level "L" to the logic level "L" and the logic level "H", respectively, at the end of a cycle of clock pulse signal CP, and the immediately preceding logical values are thus transferred to the latter stage. Similarly, the logical values of serial data are transferred sequentially to the latter stage whenever the clock pulse signal CP turns low or high, in which case the shift register 40 functions as shift register.

According to the above-described configuration, it is possible for the latch section of each shift register stage 41 to be composed of common-base transistors Q41 and Q43 and common-collector transistors Q42 and Q44, and for each register stage to be composed of ten elements, which is not more than half the number of elements for a conventional shift register stage with a reset function, through transferring signals by the collector currents of the transistors Q42 and Q44, thus further improving integration.

Thereupon, integration equivalent to that of IIL (Integrated Injection Logic), as well as a higher speed than IIL, can be attained without the need of going through any special manufacturing process, which is clearly advantageous for use in the processing of serial data.

(2) Second Embodiment

Next, the second embodiment of this invention will be described by using FIG. 6.

Figure 6:
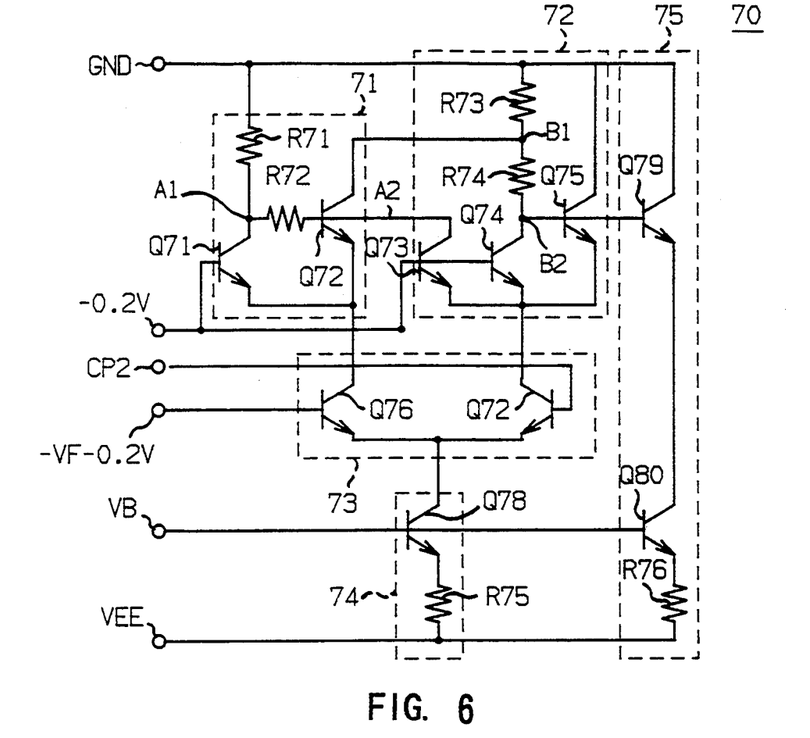
FIG. 6 is a connection diagram showing a frequency divider using the second embodiment of an emitter coupled logic circuit of this invention.

FIG. 6 shows an ECL-type frequency divider 70 as a whole, which is composed of latch gates 71 and 72 constituting holding circuits, a switching gate 73 alternately switching these latch gates 71 and 72, a current source 74, and an output stage 75.

In the case of this embodiment, the latch gate 71 is composed of a common-base transistor Q71 and a common-collector transistor Q72 with the emitters connected in common, wherein the base of the transistor Q72 is connected to the collector of the transistor Q71 via a resistor R72.

Here, the collector of the transistor Q71 is grounded to the ground potential (GND) via the resistor Q72, and the resistor Q71, across which a logical amplitude develops, and its base is supplied with a constant voltage of −0.2 [V].

The other latch gate 72, on the other hand, is composed of common-base transistors Q73 and Q74 and a common-collector transistor Q75 whereof the transistor Q73 which transfers data to the former latch gate 71 by a collector current flowing according to the data held.

Here, a constant voltage of −0.2 [V] is applied to the bases of the common-base transistors Q73 and Q74, whereas the collector of the transistor Q73 is set to the base potential of the transistor Q72 of the former latch gate 71.

Also, the base of the transistor Q75, is connected to the collector of the transistor Q74. The collector of the transistor Q74 is supplied with the ground potential (GND) at the other end and is connected to resistors R74 and R73. The collector of the transistor Q72 of the former latch gate 71 is connected to the connection node of the resistors R73 and R74.

The switching gate 73, consisting of a differential pair of transistors Q76 and Q77, feeds the collector current to be led into the current source 74 connected to the emitter to either the latch gate 71 or 72, thereby switching the operational states of the latch gates.

The frequency divider 70 outputs at its output terminal the logical output of the second latch gate 72 from its output stage 75, consisting of a buffer transistor Q79, a transistor Q80 constituting a current source, and a resistor R76.

Figure 7A:
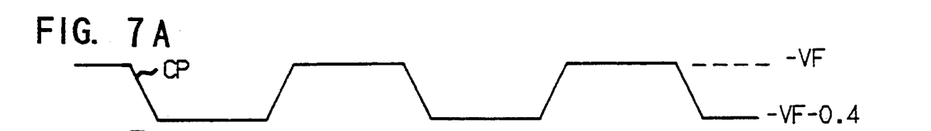
FIGS. 7A to 7C are signal waveform diagrams explaining the behavior of the frequency divider shown in FIG. 6.

The following describes the behavior of the frequency divider 70 in the above-described composition, on the assumption that the clock-pulse signal CP is the logic level "H" (FIG. 7A), and the transistor Q74 of the latch gate 72 is "OFF".

The collector current I0 flowing into the transistor Q78 of the current source 74, is shunted by the transistor Q73 for transfer to the current source Q74 constituting the latch section, so that a fractional collector current I/2 tantamount to half of the collector current I0 flows through the transistor Q74.

Figure 7B:
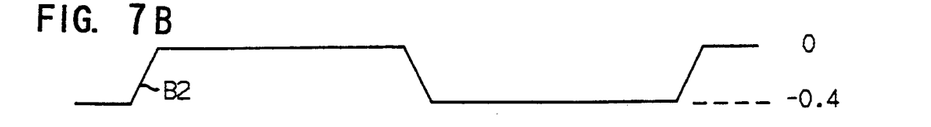

This fractional current I/2 flows through the two resistors R73 and R74 (=R+R) whereupon the potential at the node B2 falls to −0.4 [V], as shown in FIG. 7B, and the output voltage Q turns to the logic level "L". Thereupon, the base potential of the transistor Q75 becomes 0.2 [V] lower than the base potential (−0.2 [V]) of the other transistor Q74, thus keeping the transistor Q75 in its "OFF" state.

Figure 7C:
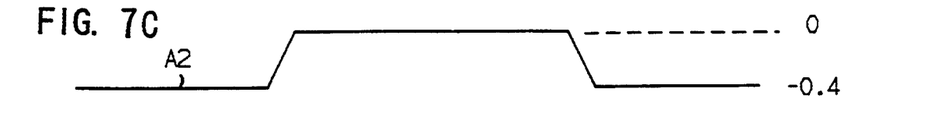

On the other hand, the current (I/2) through the transistor Q73 for transfer is led in via the resistors R71 and R72 (=R+R) so that the potential at A2 falls to −0.4 [V], as shown in FIG. 7C.

Subsequently the current switches from the transistor Q77 to the transistor Q76 when the clock pulse signal CP turns to the logic level "L" (that is, −VF−0.4 [V]), whereupon the collector current I0 flows via the transistor Q71 because the base potential of the transistor Q72 constituting the latch section of the latch gate 71 is −0.4 [V], that is, a value lower than the base potential of the other common-base transistor Q71.

Since, as the collector current I0, flowing through the resistor R71 alone is then twice as much as the current I/2 through the transistor Q73 for transfer, the potentials at A1 and A2 remain −0.4 [V].

On the other hand, the potentials at B1 and B2 of the latch gate 72 in its inactive state are both 0 [V] and thus becoming the logic level "H" because the transistors Q72 and Q74 are "OFF".

When the clock pulse signal CP becomes the logic level "H" again, the latch gate 72 switches to its active state. Since the base potential (0 [V]) of the transistor Q75 is higher than the base potential of the transistor Q74 the collector current I0 flows through the transistor Q75 whereas the other transistors Q73 and Q74 remain "OFF" because their emitter potential rises.

For this reason, no current flows through the resistor R71 of the latch gate 71 in an inactive state, so that the potentials at A1 and A2 rises from −0.4 [V] to 0 [V].

When the clock pulse signal CT then becomes the logic level "L" and the latch gate 71 switches to an inactive state, the collector current I0 flows via the resistor R73 because the transistor Q72 is "ON".

Because of this, the potential at B2 in the latch gate 72, which is in an inactive state falls from 0 [V] to −0.4 [V]. The frequency divider 70 repeats similar behavior whenever the clock pulse signal CP changes its logical value, so that an output with half as high a frequency as the clock pulse signal CP develops at the output terminal.

According to the above-described configuration, it is possible for a frequency divider to be composed of 16 elements by composing one latch gate 71 of a pair of latch gates 71 and 72 of a common-base transistor Q71, a common-collector transistor Q72, and the other latch gate 72 of a common-base transistor Q74, a common-collector transistor Q75, and a common base transistor Q73, for transfer, transferring a signal latched on the latch gate 71 by the collector current of transistor Q72, and a signal latched on the latch section 72 by current division between the transistors Q73 and Q74.

Thereby, the number of stages capable of being mounted in the same area can be markedly increased, and the scope of utilizing ECL-based frequency dividers can be notably extended.

(3) Third Embodiment

The third embodiment of this invention will be described.

As far as the above-described embodiments are concerned, we have confined ourselves to a case where the logical value applied to the clock pulse input terminal CP1 is forcibly turned to the logic level "H" when data is reset and thereby the logic outputs QS(N) and QS(N+1) are initialized to the logic level "H". Yet, this invention also allows the logical value applied to the clock pulse input terminal CP1 to be forcibly turned to the logic level "L" and thereby the logic outputs QS(N) and QS(N+1) to be initialized to the logic level "H", instead of the above constitution.

In the above-described embodiments, although we confined ourselves to a two-stage shift register, this invention is not limited to this two-stage composition, but is also widely applicable to shift registers of three or more stages.

Furthermore, although in the above-described embodiments, we confined ourselves to a case where the frequency of clock pulses is halved by a frequency divider 70, this invention is not limited to this case, but is also widely applicable to cases where the frequency of clock pulses is divided by N (N=3, 4, . . . ).

Furthermore, although in the above-described embodiments, we confined ourselves to a case where the reset signal INIT is set at −0.6 [V], this invention is not limited to this case, and the reset signal INIT may also be set at some other value.

Furthermore, although in the above-described embodiments, we confined ourselves to a case where the logical amplitude is set at 0.4 [V], this invention is not limited to this case, and the logical amplitude may also be set a some other value.

According to the above invention, when data held in the first or second self-holding circuits is to be deleted, a threshold voltage to be applied to the base electrode of the first and third transistors outside the logical amplitude, and when data is transferred, a threshold voltage is set at a value intermediate to the logical amplitude. Because of this the data held in the latch section can be reliably deleted.

Furthermore, according to the above invention, data held in the first self-holding circuit section is sent to the second self-holding circuit section based on the collector current led into the collector electrode of the second transistor, and data held in the second self-holding circuit section is transferred to the first self-holding circuit section by leading a separated collector current into the collector electrode of the third transistor through the third and fourth transistors. Because of this, it is possible to configure a frequency divider which frequency divides clock pulses which switch the operating state of the first and second self-holding circuit section with a fewer number of elements.

(4) Fourth Embodiment

The fourth embodiment of this invention will be described with reference to accompanying drawings in detail.

Figure 8:
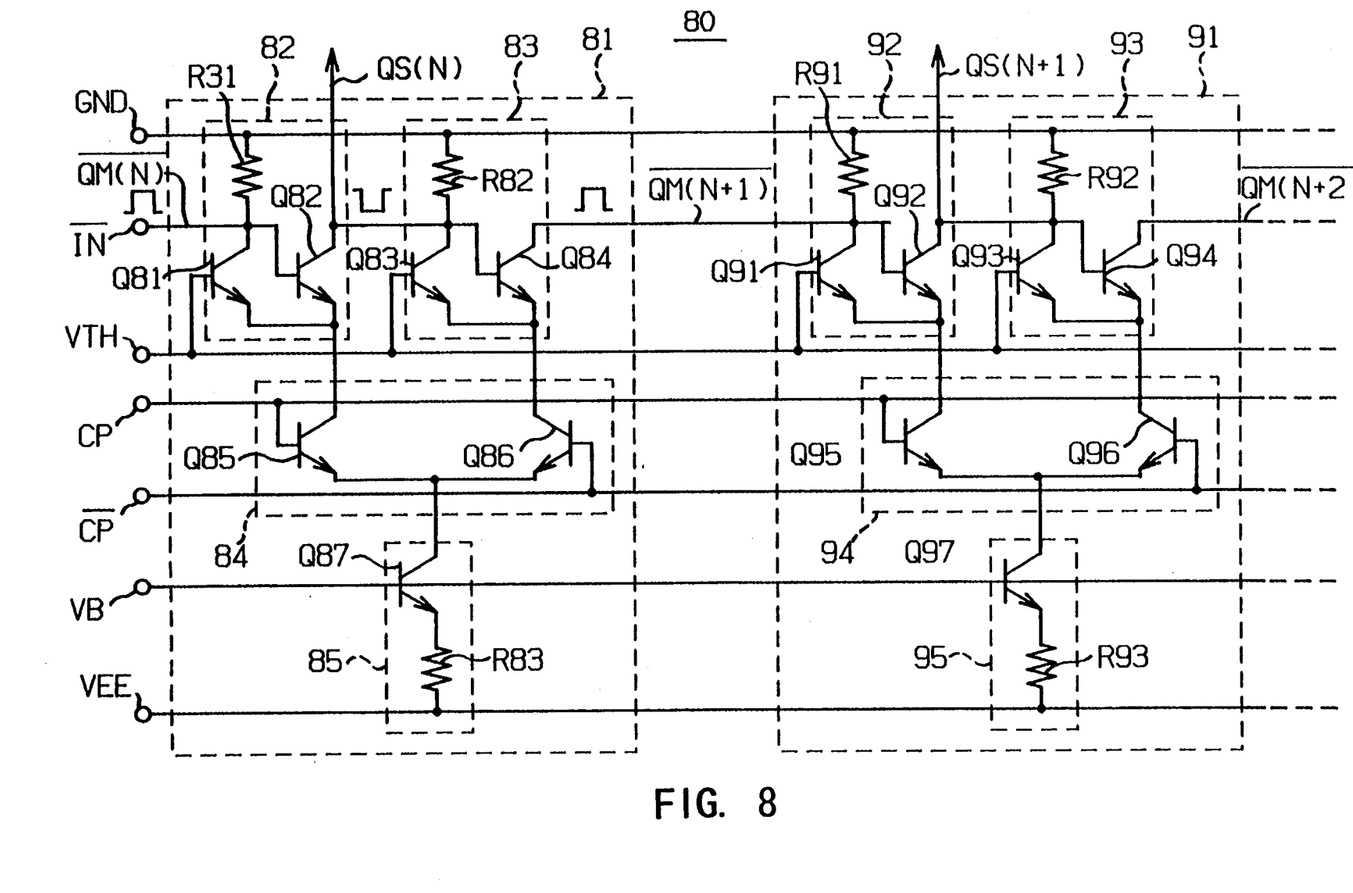
FIG. 8 is a connection diagram showing the fourth embodiment of a shift register of this invention.

FIG. 8 shows an ECL-type shift register 80 as a whole, which consists of shift register stages 81 and 91 cascade connected, each consisting of ten elements.

Here, the shift register stages 81 and 91 which are first and second stages of the shift register 80, are similar in composition to each other.

That is, the shift register stage 81 consists of two latch gates 82 and 83, a switching gate 84, and a constant-current source 85, and the shift register stage 91 consists of two latch gates 92 and 93, a switching gate 94, and a constant-current source 95.

The following describes the shift register stage 81. The latch gates 82 and 83 consist, respectively, of the NPN-type bipolar transistors Q81 and Q82 and the NPN-type bipolar transistors Q83 and Q84, the emitters of which are connected in common.

Here, as for these pairs of transistors, the bases of the common-collector transistors Q82 and Q84 are connected to the collectors of the common-base transistors Q81 and Q83 and the resistors R81 and R82, which generate logic amplitudes, are connected between the corresponding nodes and the ground potential (GND).

The latch gate 82 receives the logic output QM(N) of an inverse input signal $\overline{IN}$ and the latch gate 83 receives the logic output QS(N) of the latch gate 82 to switch to "ON" either the transistor pair, Q81 and Q82, or the transistor pair, Q82 and Q84 based on the result of comparison with the threshold voltage to be inputted to the bases of transistors Q81 and Q83.

The switching gate 84, consisting of a differential pair of transistors Q85 and Q86 turns to "ON" the latch gate 82 when the logic level "H" clock pulse signal is inputted from the clock pulse input terminal $\overline{CP}$, and turns to "ON" the latch gate 83 when the logic level "H" inverse clock pulse signal is inputted from the inverse clock pulse input terminal, C, thus changing the operational state.

The switching gate 84 directs the logical value of the logic output, $\overline{SM(N)}$ of the reverse input signal, $\overline{IN}$, to be retained if the potential of the clock pulse input terminal CP is the logic level "H", and selects whether or not to lead in a collector current through the resistor R82 of the latter latch gate 83 in an inactive state, thus making a logic output QS(N) of the logical value contrary to the logic output $\overline{QM(N)}$ develop across the resistor R82.

The potential of the inverse clock pulse input terminal, $\overline{CP}$, then becomes the logic level "L", whereupon the switching gate 84 directs the latter latch gate 83 to retain the logical value of the logical output QS(N) developed across the resistor R82 and selects whether or not to introduce a collector current through the resistor 91 of the latch gate 92 of the latter shift register stage 91 in an inactive state, thus making a logic output, $\overline{QM(N+1)}$ of the logical value contrary to the logical output QS(N) develop across the resistor, R91.

The logical output, $\overline{QM(N+1)}$, from the output terminal of the shift register stage 81 then has the same phase as the logical output $\overline{QM(N)}$, inputted to the input terminal, and the shift register 81 transfers the logical output $\overline{QM(N)}$ given to the input terminal to the shift register stage 91 on the clock pulse signal CP.

In this embodiment, the first latch gate 82 of the shift register stage 81 has no function for fetching the inverse input signal $\overline{IN}$ when the clock pulse signal CP is the logic level "H", and hence an inverse signal $\overline{IN}$ with regards to the inversion of the input signal IN is given by a gate drive circuit shown in FIG. 4 to the latch gate 82.

In this embodiment, the threshold voltage VTH to be applied to the former transistors, Q81, Q83, Q91, and Q93 of the latch gates 82, 83, 92, and 93 is set at 0.2 [V], whereby either Q81 or Q82, either Q83 or Q84, either Q91 or Q92, and either Q93 and Q94 are turned "ON" and the others are turned "OFF" in accordance with the threshold voltage VTH and the inverse input signal $\overline{IN}$.

In the above composition, data is transferred to the shift register 80 based on the clock pulse signal CP when the input signal IN starts entering as serial data. The following describes a case where the clock pulse signal CP is the logic level "L", and the logical output QS(N) of the first shift register stage 81 and the logical output QS(N+1) of the second shift register stage 91 are the logic level "H" or "L".

In this case, the transistors Q86 and Q96 of the switching gates 84 and 94 each turns "ON", whereupon the latter latch gates 83 and 93 behave as latch circuits and hold the logical values of the logical output QS(N) and the logical output QS(N+1).

On the other hand, the latch gate 92 constituting the former stage of the second shift register stage 91 is in an inactive state at that time, whereupon the logical value of the logical output IQM(N+1) of the latch gate 83 is determined by the collector current which the transistor Q84.

Because the logical value of the logic output, QS(N) of the shift register stage 83 is now the logic level "H", the inversion of the logical output QS(N), the logic level "L", is transferred as the logical output, $\overline{QM(N+1)}$.

Subsequently, when the clock pulse signal, CP, goes to the logic level "H", the transistors Q85 and Q95 of the latch gates 84 and 94 each go to "ON", whereupon the former latch gates 82 and 92 behave as latch circuits and hold the logical output $\overline{QM(N)}$ and the logical output $\overline{QM(N+1)}$.

The logic output QS(N) of the shift register stage 81 and the logical output QS(N+1) of the shift register stage 91 thereby cease to transfer to the latter latch gates 83 and 93 via the transistors Q84 and Q94 whereas the other latch gates 82 and 92 are put in an active state and hold the newly established state.

For instance, if the logical value of the immediately preceding inverse input signal $\overline{IN}$ is the logic level "H", because the latch gate 82 will hold this logical value, and the transistor Q82 will go to "ON" the logical output, QS(N), of the shift register stage 81 will take the logic level "L", or the inverse logical value.

Also, as the latter latch gate 92 of the shift register 91 holds the logic level "L", or the logical value of the logic output, $\overline{QM(N+1)}$, the transistor Q91 goes to "ON", whereupon the logic level "H" is outputted as the logical output QS(N+1) because no collector current flows.

Just when one cycle of the clock pulse signal CP has ended, the logic output QS(N) of the shift register stage 81 and the logic output, QS(N+1) of the shift register state 91 turn from the logic level "H" and the logic level "L" to the logic level "L" and the logic level "H" respectively, whereupon the immediately preceding logical values are transferred. Similarly, whenever the clock pulse signal, CP, rises or falls, the logical value of serial data is sequentially transferred to the latter stage and thus the shift register 80 functions as a shift register.

According to the above configuration, omission of the transfer gates 2 and 12 (FIG. 1), as well as operation of the former latch gate 82 and the latter latch gate 83 by one single switching gate 84 through configuring the latch section of the shift register stage 81 of the common-base transistors Q81 and Q83 and the common-collector transistors Q82 and Q84, and transferring signals by the collector currents of the transistors Q82 and Q84. Thus, the shift register stage 81 or 91 can be composed of at least 50% fewer elements than those of the conventional shift register stage 1, and hence it is possible to improve integrity a step further.

Thereupon integrity almost equivalent to that of an IIL, as well as higher speed than an IIL, can be attained without the need to go thorough any special manufacturing process, which is clearly advantageous for the processing of serial data.

Moreover, the imitability of transfer gates helps to nearly halve power consumption against that of any conventional shift transistor.

Although in the above-described embodiment, the shift register is composed of two stages, the scope of this invention is not limited to this configuration but this invention can be widely applied to the connection of three or more stages.

Again, although in the above-described embodiment, the threshold voltage, VTH is limited to −0.2 [V], this invention is not limited to this instance, but allows for other voltage values to be set as well.

As described above, this invention enables a shift register to be composed of at least 50% fewer elements than before, and can bring about a marked improvement in integration, and a marked reduction in power consumption, by arranging a first self-holding circuit section consisting of first and second transistors, a second self-holding circuit section consisting of third and fourth transistors, and a switching circuit alternately switching the operational states of the first and second self-holding circuit sections, and transferring data retained in the first self-holding circuit section to the second self-holding circuit section on a collector current led from the collector electrode of the third transistor to the collector electrode of the second transistor.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. An emitter coupled logic circuit comprising:
a first self-holding circuit section, wherein the collector electrode of a first transistor is connected to the base electrode of a second transistor with their emitter electrodes connected in common;
a second self-holding circuit section, wherein the collector electrode of a third transistor is connected to the base electrode of a fourth transistor with their emitter electrodes connected in common; and
switching means, consisting of a differential pair of fifth and sixth transistors the collector electrodes of which are each connected to the common emitters of said first and second transistors and the common emitters of said third and fourth transistors, for alternately switching the operational states of said first and second self-holding circuit sections based on a clock pulse signal applied to the base electrodes: wherein
said first and second self-holding circuit sections set the threshold voltage to be applied to the base electrodes of said first and third transistors outside a logical amplitude when erasing data; and
said first and second self-holding circuit sections set said threshold voltage at the intermediate value of said logical amplitude to transfer data and transfer the data held in said first self-holding circuit section to said second self-holding circuit section, based on the collector current to be led from the collector electrode of said third transistor into the collector electrode of said second transistor.

2. An emitter coupled logic circuit according to claim 1, wherein;
when erasing data, said first and second self-holding circuit sections set said threshold voltage outside said logical amplitude, forcibly turn said clock pulse signal high or low, and erase the data held in either said first or second self-holding circuit section.

3. An emitter coupled logic circuit comprising:
a first self-holding circuit section, wherein the collector electrode of a first transistor is connected to the base electrode of a second transistor with their emitter electrodes connected in common;
a second self-holding circuit section, wherein the collector electrode of a fourth transistor connected in parallel with a third transistor is connected to the base electrode of a fifth transistor with their emitter electrodes connected in common;
switching means, consisting of differential pairs of sixth and seventh transistors the collector electrodes of which are each connected to the common emitters of said first and second transistors and the common emitters of said third, fourth, and fifth transistors, for alternately switching the operational states of said first and second self-holding circuit sections based on a clock pulse signal applied to the base electrodes: wherein
the collector electrode of said first transistor is connected to a power supply via a first resistor as well as is connected the base electrode of said second transistor and the collector electrode of said third transistor via a second resistor;
the collector electrode of said fourth transistor is connected to said power supply via a third resistor and a fourth resistor;
the collector electrode of said second transistor is connected to the connection midpoint of said third and fourth resistors;
said first self-holding circuit section transfers the data held in said first self-holding circuit section to said second self-holding circuit section, based on the collector current led from said third resistor into the collector electrode of said second transistor; and
said second self-holding circuit section transfers the data held in said second self-holding circuit section to said first self-holding circuit section, based on the collector current led from said first and second resistors into the collector electrode of said third transistor.

4. A shift register comprising:
a self-holding circuit section, wherein the emitter electrodes of a first transistor and a second transistor are connected in common, and the collector electrode of said first transistor is connected to the base electrode of said second transistor: wherein
the base electrode of said first transistor receives a predetermined threshold voltage, and also the common end connection of the emitter electrodes of said first transistor and said second transistor receive a predetermined current with predetermined timing, thereby inversely outputting from the collector electrode of said second transistor, an input signal to be inputted from the common end connection of the collector electrode of said first transistor and the base electrode of said second transistor.

5. A shift register comprising:
a first self-holding circuit section consisting of a first transistor and a second transistor the emitter electrodes of which are connected in common, wherein the collector electrode of the first transistor is connected to the base electrode of the second transistor;
a second self-holding circuit section consisting of a third transistor and a fourth transistor the emitter electrodes of which are connected in common, wherein the collector electrode of said third transistor is connected to the base electrode of said fourth transistor; and
switching means, consisting of a differential pair of a fifth transistor and a sixth transistor, wherein each collector electrode is connected to the common emitter of said first and second transistors and the common emitter of said third and fourth transistors, for switching alternately the operational states of said first and second self-holding circuit sections on a clock pulse signal given to the base electrodes: wherein
said first and second self-holding circuit sections receive a predetermined threshold voltage at the base electrodes of said first and third transistors and also receive an input signal at the common end connection of the collector electrode of said first transistor and the base electrode of said second transistor, whereby the data held by said first self-holding circuit section is transferred to said second self-holding circuit section on a collector current led from the collector electrode of said third transistor to the collector electrode of said second transistor.

6. A shift register according to claim 5, further comprising:
inverse signal generating means, wherein the emitter electrodes of a seventh transistor, the collector electrode of which is connected to the signal input terminal of said self-holding circuit section and to the base electrode of which a predetermined input signal is inputted, and the emitter electrodes of an eighth transistor, to the base electrode of which a predetermined threshold voltage is inputted, are connected in common, for outputting an inverse signal as the inversion of said input signal from the collector electrode of said seventh transistor into said first self-holding circuit section; and
switching means, consisting of a ninth transistor, the collector electrode of which is connected to the common end connection of the emitters of said seventh and eighth transistors and to the base electrode, of which a first clock pulse signal is inputted, and a tenth transistor, the emitter electrode of which is connected in common to said ninth transistor and to the base electrode, of which a second clock pulse signal is inputted, for controlling the switching on/off of said seventh and eighth transistors on said first and clock pulse signals: wherein
said inverse signal is outputted from said inverse signal generating means to said first self-holding circuit section at a predetermined timing through controlling the switching on/off of said seventh and eighth transistors according to the switching behavior of said switching means.

* * * * *